(12) United States Patent
Lee et al.

(10) Patent No.: US 8,853,726 B2
(45) Date of Patent: Oct. 7, 2014

(54) LIGHT EMITTING DEVICE PACKAGE AND LIGHTING SYSTEM HAVING THE SAME

(75) Inventors: Gun Kyo Lee, Seoul (KR); Nak-Hun Kim, Seoul (KR); Sun Mi Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 123 days.

(21) Appl. No.: 13/412,667

(22) Filed: Mar. 6, 2012

(65) Prior Publication Data
US 2013/0049044 A1 Feb. 28, 2013

(30) Foreign Application Priority Data

Aug. 25, 2011 (KR) .................... 10-2011-0084978
Sep. 2, 2011 (KR) .................... 10-2011-0089264

(51) Int. Cl.
*H01L 33/60* (2010.01)
(52) U.S. Cl.
USPC .... 257/98; 257/99; 257/E33.061; 257/E33.072; 257/E33.073
(58) Field of Classification Search
CPC ........ H01L 33/52; H01L 33/56; H01L 33/642
USPC ............ 257/13, 79, 95, 98.99, 100, 257, 676, 257/678, 692, E33.067, E23.001, E21.449, 257/E23.06, E33.056, E33.066, E33.062
See application file for complete search history.

(56) References Cited

U.S. PATENT DOCUMENTS

| | | | |
|---|---|---|---|
| 2003/0168720 A1* | 9/2003 | Kamada ........................ | 257/666 |
| 2006/0097245 A1* | 5/2006 | Aanegola et al. ............... | 257/26 |
| 2007/0029563 A1* | 2/2007 | Amano et al. .................. | 257/98 |
| 2007/0181901 A1* | 8/2007 | Loh ................ | 257/99 |
| 2008/0012036 A1* | 1/2008 | Loh et al. ........ | 257/99 |
| 2009/0078958 A1* | 3/2009 | Wu et al. ........ | 257/99 |
| 2011/0272716 A1* | 11/2011 | Lee et al. ........ | 257/88 |

* cited by examiner

*Primary Examiner* — William F Kraig
*Assistant Examiner* — Pavel Ivanov
(74) *Attorney, Agent, or Firm* — Birch, Stewart, Kolasch & Birch, LLP

(57) ABSTRACT

Disclosed are a light emitting device package and a lighting system including the same. The light emitting device package includes a first lead frame and a second lead frame disposed on an insulating layer and electrically separated from each other by a separation part, and a light emitting device disposed on the second lead frame and electrically connected to the first lead frame, and the second lead frame includes a through part disposed opposite to the separation part such that the light emitting device is located therebetween.

20 Claims, 12 Drawing Sheets

US 8,853,726 B2

LIGHT EMITTING DEVICE PACKAGE AND LIGHTING SYSTEM HAVING THE SAME

CROSS REFERENCE TO RELATED APPLICATION

This application claims priority under 35 U.S.C. §119 to Korean Patent Application No. 10-2011-0084978, filed in Korea on Aug. 25, 2011 and No. 10-2011-0089264, filed in Korea on Sep. 2, 2011, which are hereby incorporated in their entirety by reference as if fully set forth herein.

TECHNICAL FIELD

Embodiments relate to a light emitting device package and a lighting system including the same.

BACKGROUND

Light emitting devices, such as light emitting diodes or laser diodes using group III-V or II-VI compound semiconductor materials, implement light of various colors, such as red, green, blue, and ultraviolet light, due to development of thin film growth techniques and device materials, and implement white light using fluorescent materials or through color mixing.

Due to development of such technology, light emitting devices are increasingly applied not only to display devices, but also to transmission modules of optical communication units, light emitting diode backlights substituting for cold cathode fluorescent lamps (CCFLs) constituting backlights of liquid crystal display (LCD) devices, lighting apparatuses using white light emitting diodes substituting for fluorescent lamps or incandescent lamps, head lights for vehicles and traffic lights.

The light emitting devices are mounted on a package body, thus forming a light emitting device package. In the light emitting device package, a pair of lead frames is mounted on the package body formed of silicon or PPA resin, and the light emitting devices are electrically connected to the lead frames.

SUMMARY

Embodiments provide a light emitting device package and a lighting system including the same.

In one embodiment, a light emitting device package includes a first lead frame and a second lead frame disposed on an insulating layer and electrically separated from each other by a separation part, and a light emitting device disposed on the second lead frame and electrically connected to the first lead frame, the light emitting device includes a light emitting structure having a first conduction type semiconductor layer, an active layer, and a second conduction type semiconductor layer, wherein the second lead frame includes a through part disposed opposite to the separation part such that the light emitting device is located therebetween.

The width of the separation part may be substantially equal to the width of the through part.

The width of the through part may be 20~40 µm.

A distance between the through part and the light emitting device may be substantially equal to a distance between the separation part and the light emitting device.

The shape of the separation part may be substantially equal to the shape of the through part.

The overall length of the separation part may be greater than the overall length of the through part.

The cross-section of at least a portion of the separation part and/or the through part may have an irregular curved shape.

The irregular curved shape of the separation part and the irregular curved shape of the through part may be symmetrical with respect to a point, or may be symmetrical with respect to a line.

The light emitting device package may further include a lens on the light emitting device, and the width of the through part may be substantially equal to the width of the separation part disposed opposite to the through part such that the condition that the light emitting device is located therebetween.

The irregular curved shape of the separation part or the through part may correspond substantially to the lens.

The area of the separation part corresponding to the lens may be substantially equal to the area of the through part corresponding to the lens.

A first concave part may be disposed on the second lead frame at an area in which the light emitting device is disposed, and a distance between the first concave part and the through part may be substantially equal to a distance between the first concave part and the separation part.

The light emitting device package may further include a resin layer on the light emitting device, disposed on the second lead frame and including phosphors, and a groove may be disposed on the second lead frame corresponding to the edge of the resin layer.

The light emitting device package may further include second concave parts disposed on the first lead frame and the second lead frame.

The cross-section of at least one of the first lead frame or the second lead frame may have a curved shape at positions adjacent to the second concave parts.

The second concave parts may be disposed at the corners of the first lead frame and the corners of the second lead frame.

The cross-section of at least a portion of the separation part and/or the through part may have an irregular curved shape, and the irregular curved shape of the separation part and/or the through part may correspond to the second concave parts.

In another embodiment, a light emitting device package includes a first lead frame and a second lead frame disposed on an insulating layer and electrically separated from each other by a separation part, and a light emitting device disposed on the second lead frame and electrically connected to the first lead frame, the light emitting device includes a light emitting structure having a first conduction type semiconductor layer, an active layer, and a second conduction type semiconductor layer, wherein a first concave part is disposed on the second lead frame at an area in which the light emitting device is disposed, and second concave parts are disposed at the edges of the first lead frame and the second lead frame.

The light emitting device package may further include an insulating layer disposed under the first concave part and the second concave parts.

In a further embodiment, a lighting system includes a light emitting device package including a first lead frame and a second lead frame disposed on an insulating layer and electrically separated from each other by a separation part, and a light emitting device disposed on the second lead frame and electrically connected to the first lead frame, the light emitting device includes a light emitting structure having a first conduction type semiconductor layer, an active layer, and a second conduction type semiconductor layer, the second lead frame including a through part disposed opposite to the separation part such that the light emitting device located therebetween, a circuit board electrically connected to the first lead frame and the second lead frame, and optical members transmitting light emitted from the light emitting device package.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

Figure 1:
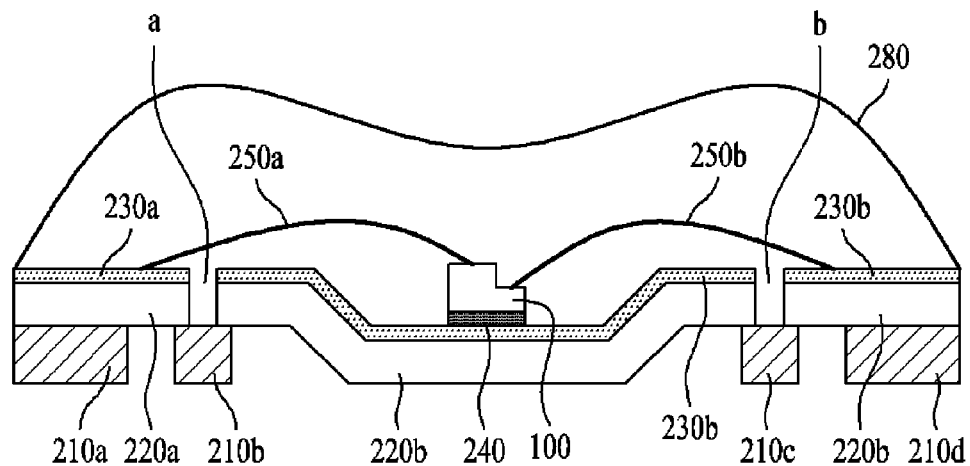
FIG. 1 is a longitudinal-sectional view of a light emitting device package in accordance with a first embodiment.

FIG. 1 is a longitudinal-sectional view of a light emitting device package in accordance with a first embodiment.

The light emitting device package in accordance with this embodiment includes first to fourth insulating layers 210a~210d, first lead frame 220a and second lead frame 220b disposed on the first to fourth insulating layers 210a~210d and physically separated from each other by a designated interval, a light emitting device 100 electrically connected to the first lead frame 220a and the second lead frame 220b and disposed on surfaces of the first frame 220a and the second lead frame 220b opposite to the first to fourth insulating layers 210a~210d, and a lens 280 surrounding the light emitting device 100.

The light emitting device 100 is disposed on the second lead frame 220b, and a recessed part is formed on the second lead frame 220b at an area where the light emitting device 100 is disposed. The second lead frame 220b is manufactured through the same process of the first lead frame 220a, and may be formed of a conductive material.

In these embodiments or other embodiments, the light emitting device 100 may be semiconductor light emitting device, for example light emitting diode.

Figure 2:
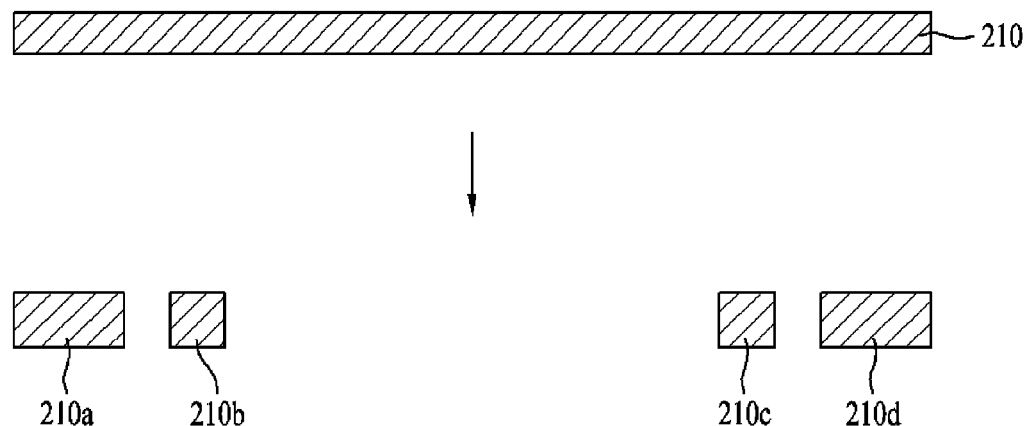
FIGS. 2 to 6 are longitudinal-sectional views of a fabrication method of the light emitting device package of FIG. 1.

Although FIG. 1 illustrates the second lead frame 220b as being separated into portions, the second lead frame 220b is separated into the portions at some areas, as shown in FIG. 2. That is, FIG. 1 is a longitudinal-sectional view of an area of the light emitting device package of FIG. 2 where the third insulating layer 210c is exposed, and thus the second lead frame 220b is separated into two portions.

In FIG. 1, an area where the first lead frame 220a and the second lead frame 220b are separated from each other may be referred to as a separation part a, and an area where the second lead frame 220b is separated into the two portions may be referred to as a through part b which actually passes through the second lead frame 220b to expose the third insulating layer 210c.

The first lead frame 220a and the second lead frame 220b are formed of a conductive material, for example copper (Cu), and need to be electrically separated from each other so as to prevent an electrical short between the first lead frame 220a and the second lead frame 220b.

The first to fourth insulating layers 210a~210d are separated into at least two portions, and may be separated using the recessed part of the second lead frame 220b as a boundary. Further, the first insulating layer 210a and the second insulating layer 210b don't necessarily need to be separated from each other, and the third insulating layer 210c and the fourth insulating layer 210d don't necessarily need to be separated from each other.

At the area where the first lead frame 220a and the second lead frame 220b are separated from each other, the first lead frame 220a and the second lead frame 220b are supported by the second insulating layer 210b, and thus the second insulating layer 210b is exposed.

The above insulating layers 210b and 210c are exposed at the same width in a first direction and a second direction opposite to the first direction at a peripheral area of the light emitting device 100. The peripheral area of the light emitting device 100 means a surrounding area of the light emitting device 100 to which light emitted from the light emitting device 100 is transmitted, and may be within an area shown by an alternated long and short dashed line of FIGS. 7A and 7B. The first direction may mean a left area of the light emitting device 100 of FIGS. 7A and 7B, and the second direction may mean a right area of the light emitting device 100.

Figure 7A:
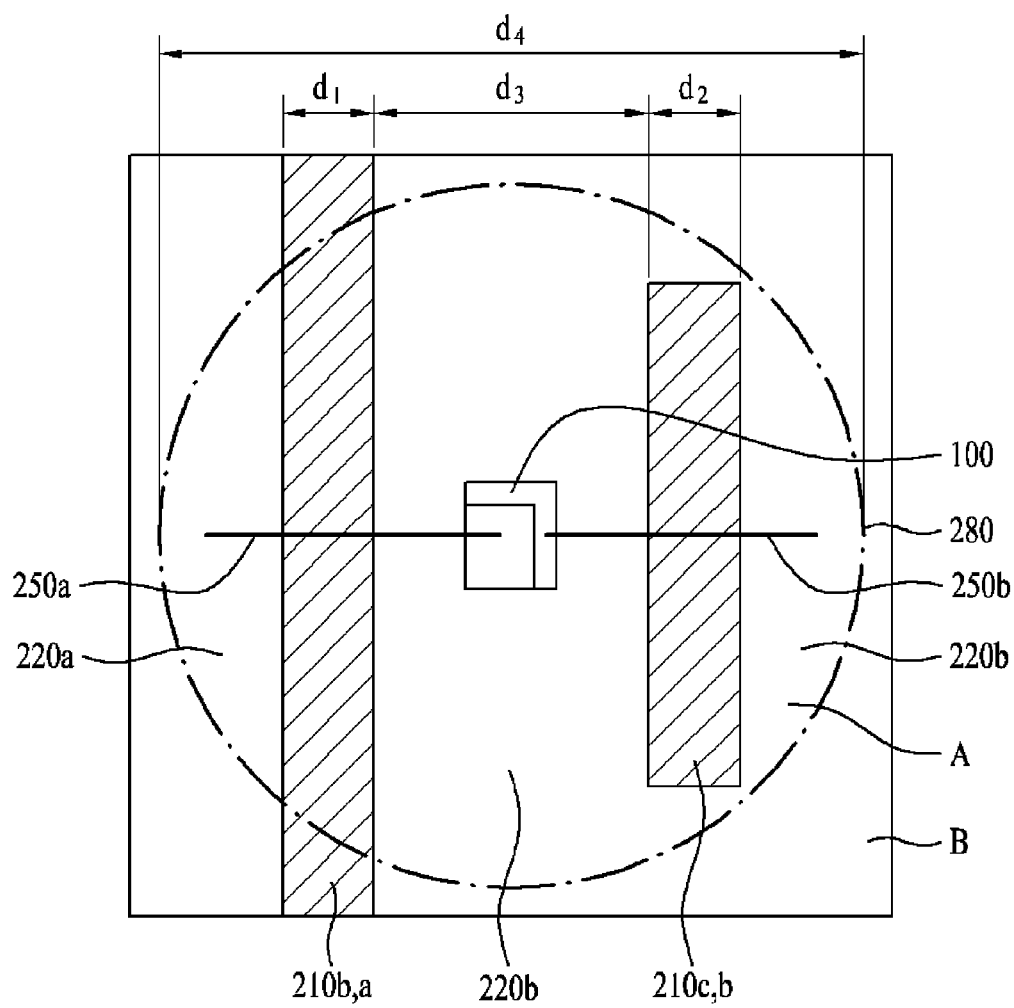
FIGS. 7A and 7B are plan views of the light emitting device package of FIG. 1.

As shown in FIG. 7A, the second insulating layer 210b and the third insulating layer 210c are exposed at the same widths $d_1$ and $d_2$ with an area 'A' shown by the alternated long and short-dashed line. The second insulating layer 210b and the third insulating layer 210c may be exposed by 20 to 40 μm in the horizontal direction of FIG. 7A. In FIG. 7A, the horizontal direction may be a direction from the light emitting device 100 to the second insulating layer 210b and the third insulating layer 210c.

The first lead frame 220a and the second lead frame 220b are separated by the exposed width $d_1$ of the second insulating layer 210b, and such an area where the first lead frame 220a and the second lead frame 220b are separated may be referred to as 'the separation part'. Further, a space in the longitudinal direction which is formed through a designated area of the second lead frame 220b by the exposed width $d_2$ of the third insulating layer 210c may be referred to 'the through part'.

The separation part and the through part may have the same width. Further, the separation part and the through part may have the same shape, such as a rectangular shape, a polygonal shape or an oval shape, and the overall length of the separation part may be greater than the overall length of the through part.

Figure 7B:
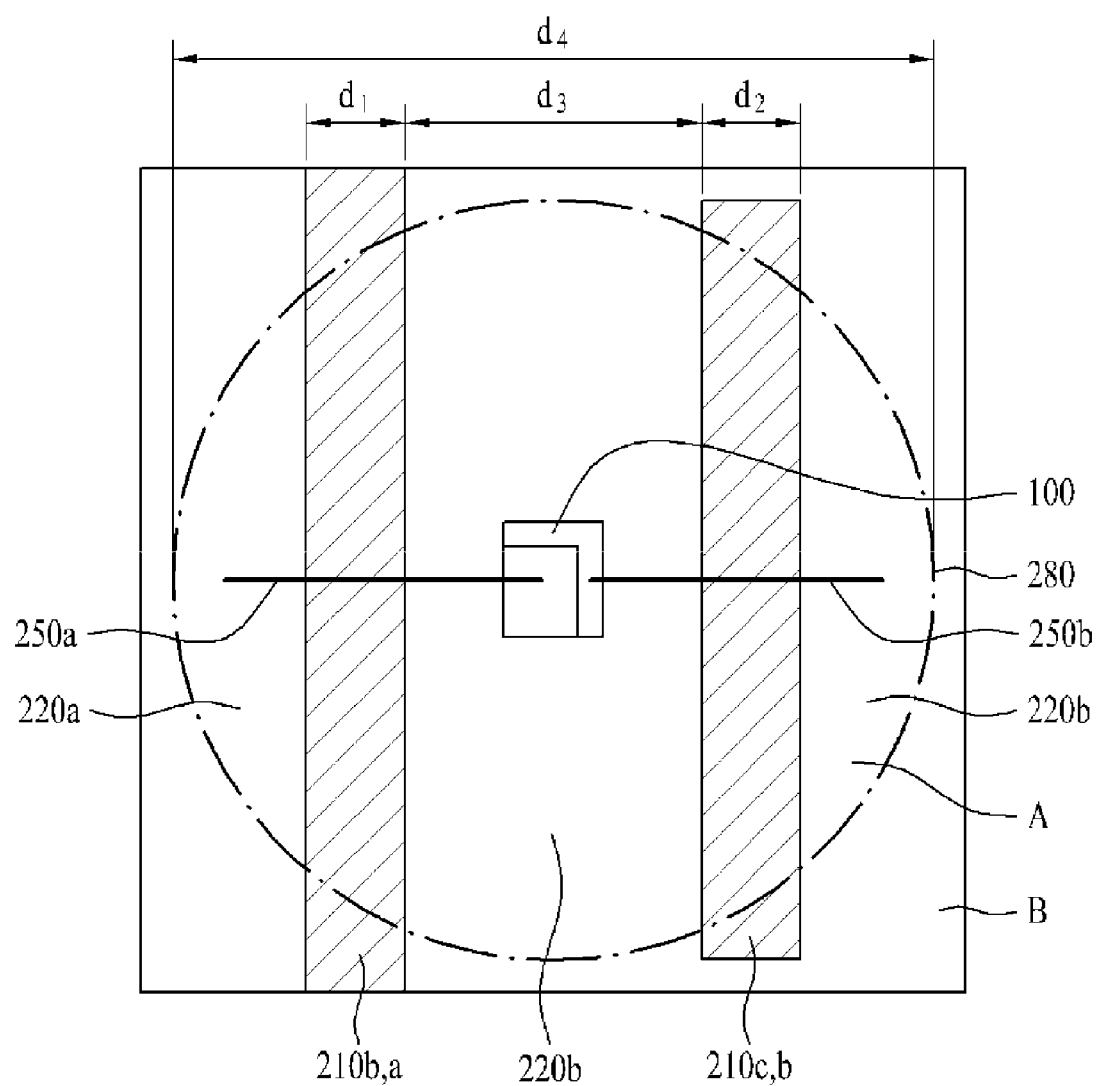

FIG. 7A illustrates the area corresponding to the edge of the lens 280 as being shown by the alternated long and short dashed line, and the widths of the separation part and the through part at the area corresponding to the lens 280 are substantially equal. Although FIG. 7A illustrates the through part as being shorter than the area corresponding to the lens 280 in the longitudinal direction, the through part may be formed throughout the overall area corresponding to the lens 280 in the longitudinal direction, as shown in FIG. 7B. Here, the area of the separation part within the area corresponding to the lens 280, i.e., shown by the alternated long and short dashed line, may be substantially equal to the area of the through part within the area corresponding to the lens 280.

Further, the light emitting device 100 may be disposed between the separation part and the through part. If the light emitting device 100 is disposed in an area separated from the separation part and the through part by the same distance, light emitted from the light emitting device 100 is identically absorbed or reflected by the exposed second and third insulating layers 210b and 210c, and thus light characteristics of the light emitting device package may be improved. Further, distances from the edge of the lens 280 shown in the alternated long and short dashed line to the separation part and the through part may be substantially equal.

Further, $d_3$ represents a distance between the exposed insulating layers 210b and 210c and may be 2.39 mm within a tolerance of 10%, and $d_4$ represents a length of one side surface of the light emitting device package and may be 4.5~6.5 µm or more according to sizes of the light emitting device package.

The second insulating layer 210b separates the first lead frame 220a and the second lead frame 220b from each other and is thus exposed throughout the overall area of the light emitting device package, but the third insulating layer 210c is exposed only at the partial area A of the second lead frame 220b. That is, since the third insulating layer 210c does not completely separate the second lead frame 220b, an area where the third insulating layer 210c is exposed in the second direction forms a closed curve corresponding to the second lead frame 220b within the second lead frame 220b.

The lens 280 of FIG. 1 may be disposed at the area A shown by the alternated long and short dashed line of FIG. 7A. Here, the area A where light emitted from the light emitting device 100 is reflected or refracted may be referred to as an effective area, and the area B where action of light emitted from the light emitting device 100 is small may be referred to as a non-effective area.

FIG. 7A exemplarily illustrates that the exposed second and third insulating layers 220b and 220c have a rectangular shape, the exposed widths of the second insulating layer 220b and the third insulating layer 220c are substantially equal, as described above, and the exposed length of the second insulating layer 220b is greater than the exposed length of the third insulating layer 220c. The exposed length of the second insulating layer 210b in the above-described first direction is greater than the exposed length of the third insulating layer 210c in the above-described second direction, the length means the exposed length of the second or third insulating layer 210b or 210c in a third direction, and the third direction means a direction perpendicular to the above-described first or second direction, i.e., the vertical direction in FIG. 7A.

Further, in an area in which a portion of the second lead frame 220b is etched in FIG. 7A (an area shown as if the second lead frame 220b is cut in FIG. 1), the second lead frame 220b is supported by the third insulating layer 210c, and thus the third insulating layer 210c is exposed. The first to fourth insulating layers 210a~210d may be formed of an insulating material, such as polyimide. Further, the first to fourth insulating layers 210a~210d may be formed of a material having excellent thermal conductivity.

First and second reflective layers 230a and 230b are respectively formed on the first lead frame 220a and the second lead frame 220b, and serve to reflect light emitted from the light emitting device 100 toward the front surface of the light emitting device package (in the upward direction in FIG. 1) to increase brightness.

Light emitted from the light emitting device 100 may be partially absorbed by the exposed insulating layers 210b and 210c formed of polyimide and thus brightness of the light emitting device package may be lowered. Therefore, when the exposed widths of the first and second insulating layers 210b and 210c are decreased, lowering of brightness of the light emitting device package may be reduced.

The second insulating layer 210b serves to separate the first lead frame 220a and the second lead frame 220b from each other, and in order prevent technical limitation of an etching process and an electrical short between the first lead frame 220a and the second lead frame 220b, the second insulating layer 210b needs to be exposed by at least the above-described value. The third insulating layer 210c is exposed by patterning a portion of the second lead frame 220b, and in order to uniformize light distribution around the light emitting device 100, the third insulating layer 210c may be exposed by the same width as the second insulating layer 210b.

The first and second reflective layers 230a and 230b may be formed of a material having excellent reflectivity, for example, silver (Ag) coating. Further, the light emitting device 100 is attached to the second lead frame 220b through an adhesive layer 240, and the adhesive layer 240 may be formed of a conductive material or a non-conductive material. The light emitting device 100 is electrically connected to the first lead frame 220a and the second lead frame 220b through first and second wires 250a and 250b.

Although FIG. 1 illustrates the first and second wires 250a and 250b as contacting the first and second reflective layers 230a and 230b, the first and second wires 250a and 250b may directly contact the first lead frame 220a and the second lead frame 220b.

The lens 280 is disposed so as to surround the light emitting device 100 and the first and second wires 250a and 250b. Although not shown in the drawings, a resin layer (not shown) may surround the light emitting device 100 and the first and second wires 250a and 250b, and may include phosphors to change the wavelength of light emitted from the light emitting device 100.

The lens 280 may be formed of a material having high light transmittance, for example, polymethylmethacrylate (PMMA), polycarbonate (PC), polyethylene (PE) or a resin injection-molded product.

Although not shown in the drawings, a heat dissipation layer may be disposed on the lower surfaces of the first to fourth insulating layers 210a~210d. The heat dissipation layer may be formed of a material having high heat conductivity, such as silver (Ag), copper (Cu) or aluminum (Al). The heat dissipation layer serves to dissipate heat generated from the light emitting device 100 in the downward direction via the second lead frame 220b.

A circuit board may be disposed above the first lead frame 220a and the second lead frame 220b. Since heat generated from the circuit board may be discharged in the upward direction of FIG. 1, heat generated from the light emitting device 100 and heat generated from the circuit board may be effectively discharged. Further, since the package body is omitted and the circuit board is disposed above the lead frames 220a and 220b, the thickness of the light emitting device package may be reduced.

FIGS. 2 to 6 are longitudinal-sectional views of a fabrication method of the light emitting device package of FIG. 1.

As shown in FIG. 2, the first to fourth insulating layers 210a~210d are formed by patterning a polyimide layer 210. Here, the polyimide layer 210 may be punched. The first to fourth insulating layers 210a~210d may be completely separated from each other, or may be locally separated from each other at some areas through punching and be connected on the whole.

Figure 3:
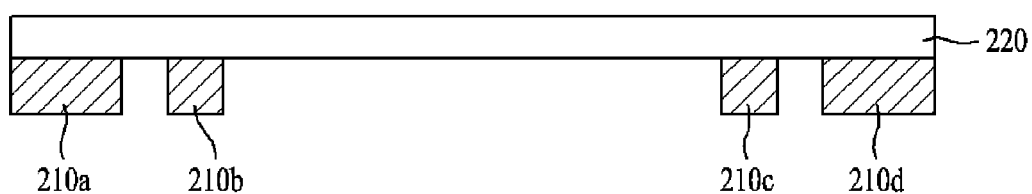

Thereafter, as shown in FIG. 3, a conductive layer material 220 is disposed on the upper surfaces of the first to fourth insulating layers 210a~210d through lamination.

Figure 4:
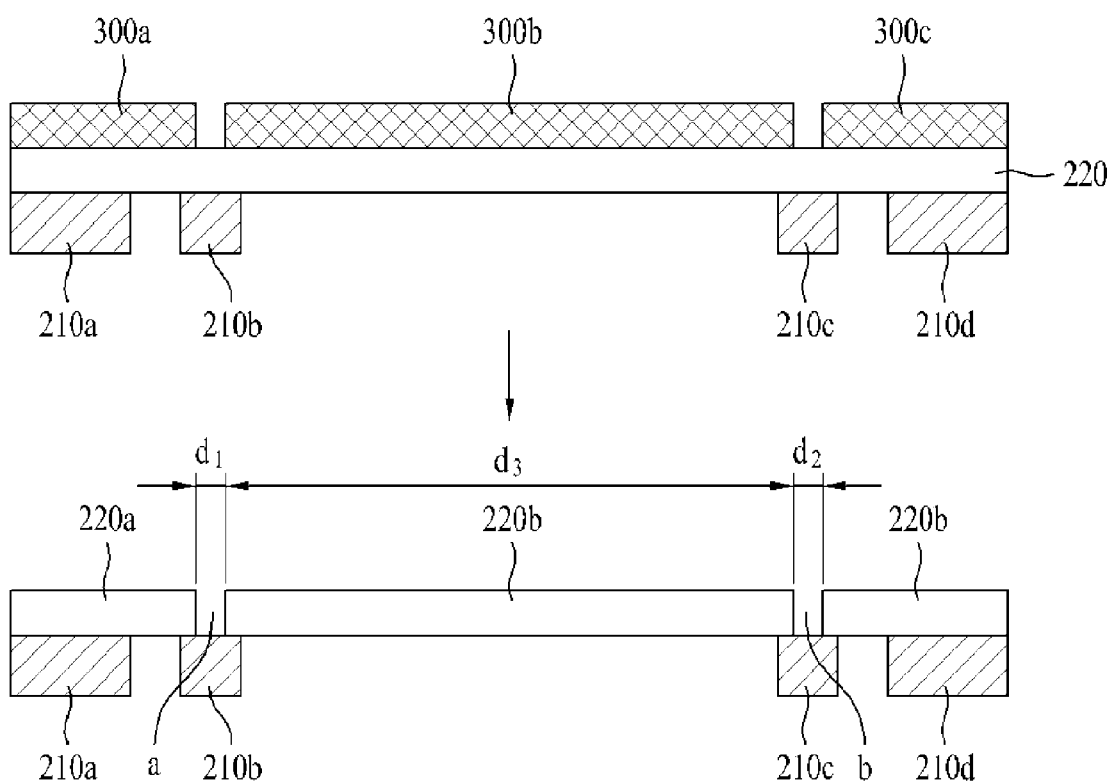

Thereafter, as shown in FIG. 4, the conductive layer material 220 is separated into the first lead frame 220a and the second lead frame 220b and a portion of the second lead frame 220b is exposed through patterning. Here, etching and isolation processes may be carried out through photolithography. After these processes, the separation part a and the through part b may be formed, as shown in FIG. 4.

The separation distance $d_1$ between the first lead frame 220a and the second frame 220b, the exposed distance $d_2$ of the second lead frame 220b and the distance $d_3$ between the distances $d_1$ and $d_2$ have been described above. After the etching and isolation processes, the first lead frame 220a and the second lead frame 220b are formed by patterning the conductive layer material 220 using a mask 300a~300c.

Figure 5:
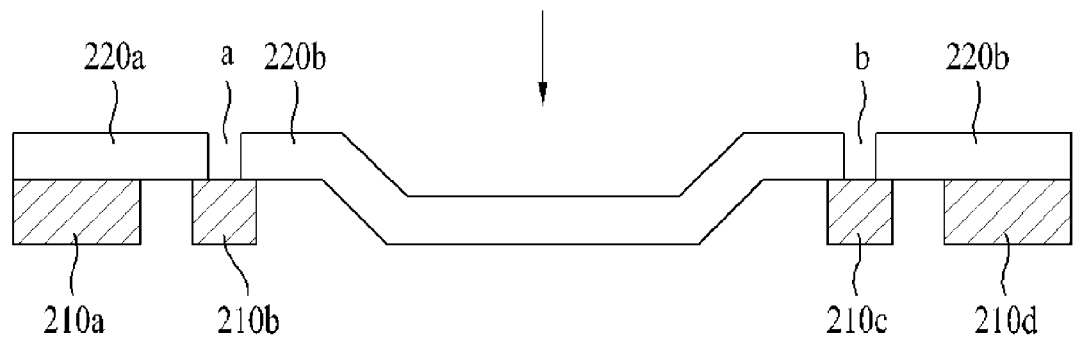

As shown in FIG. 5, the central area of the second lead frame 220b is down-set, thereby forming a recessed part.

Figure 6:
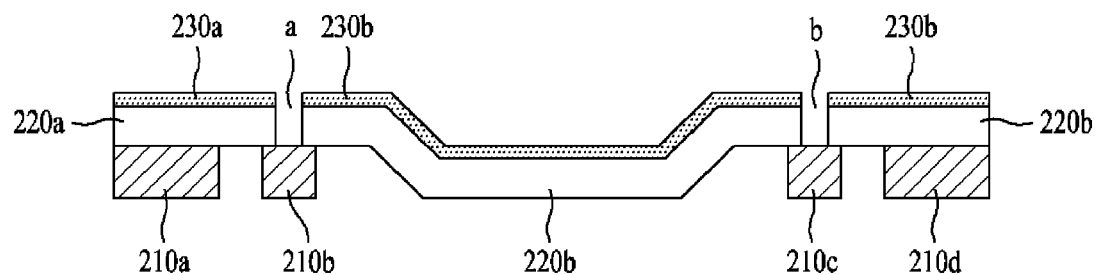

Thereafter, as shown in FIG. 6, the reflective layers 230a and the 230b are formed on the upper surfaces of the first lead frame 220a and the second lead frame 220b through plating using silver (Ag).

Thereafter, the light emitting device 100 is disposed on the second lead frame 220b, and is bonded to the first lead frame 220a and the second lead frame 220b through the first and second wires 250a and 250b. Further, the light emitting device 100 and the first and second wires 250a and 250b are surrounded by the lens 280 or a resin layer (not shown), thereby completing the light emitting device package of FIG. 1. The resin layer may include phosphors, and the lens 280 may increase the orientation angle of light emitted from the light emitting device 100.

Figure 8:
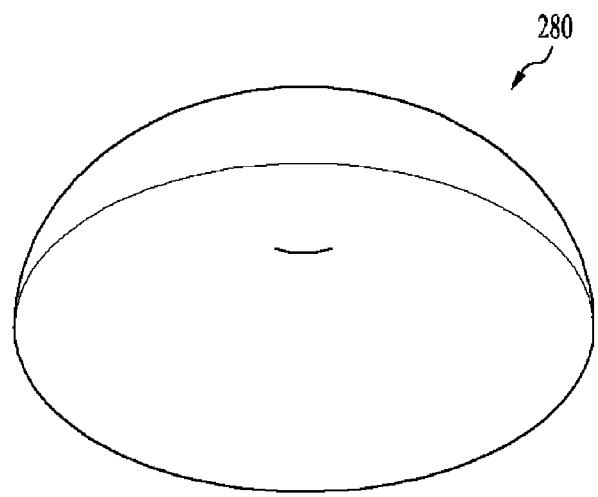
FIG. 8 is an exploded perspective view of a light emitting device package in accordance with a second embodiment.
Figure 8:
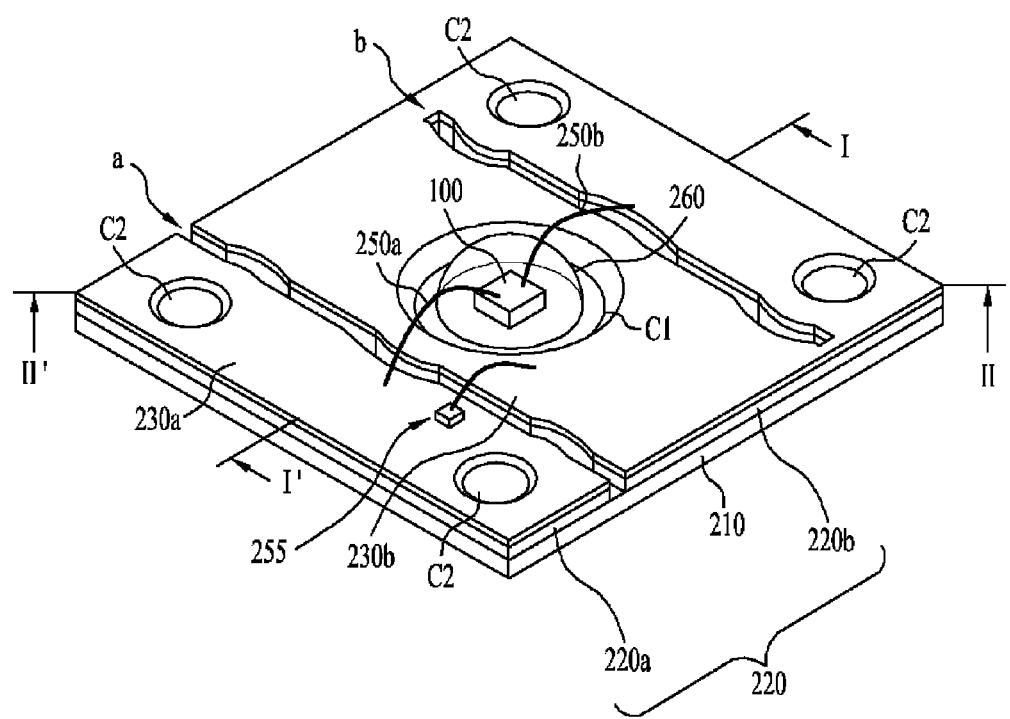
Figure 9:
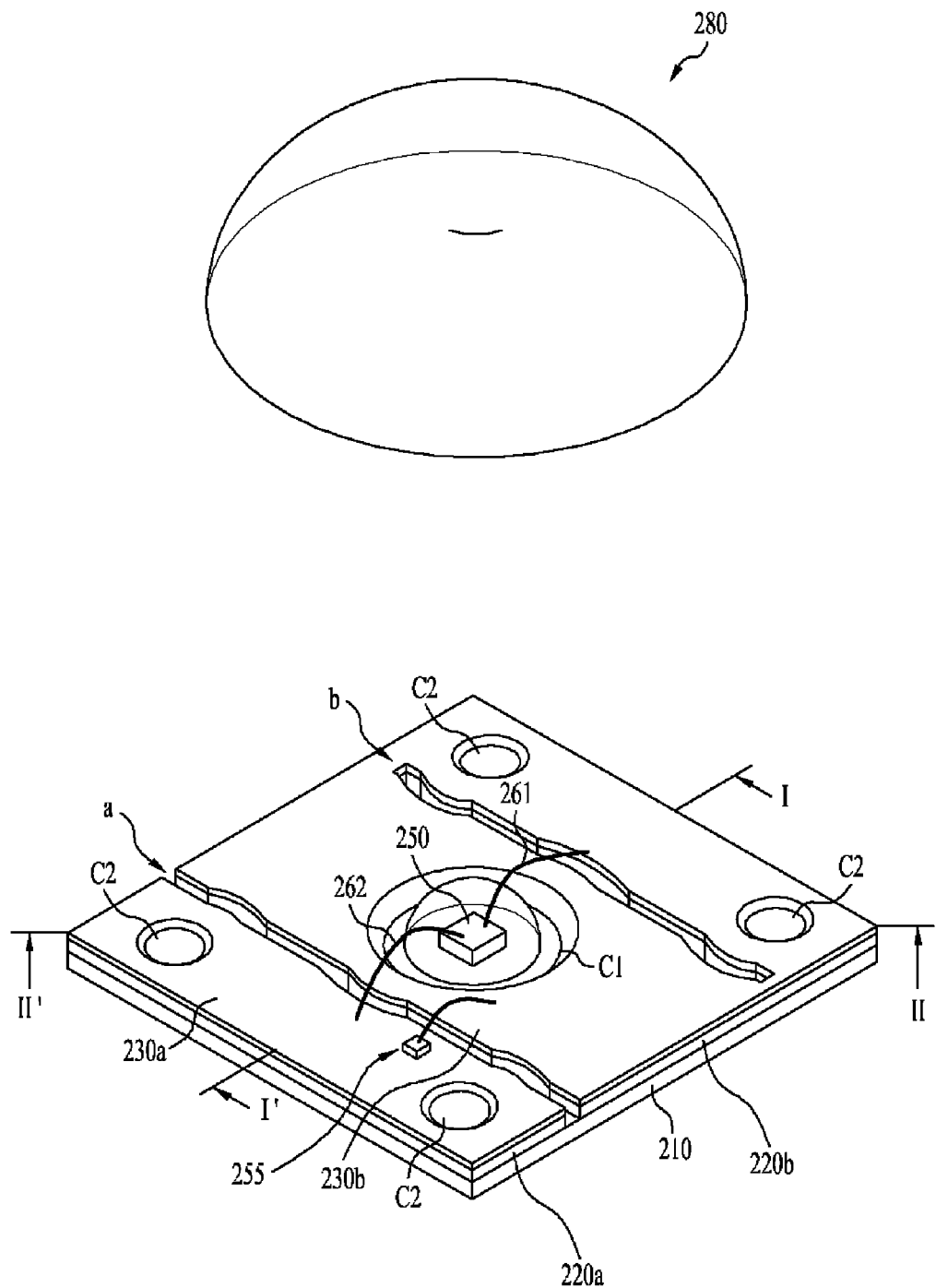
FIG. 9 is an exploded perspective view of a light emitting device package in accordance with a third embodiment.
Figure 10:
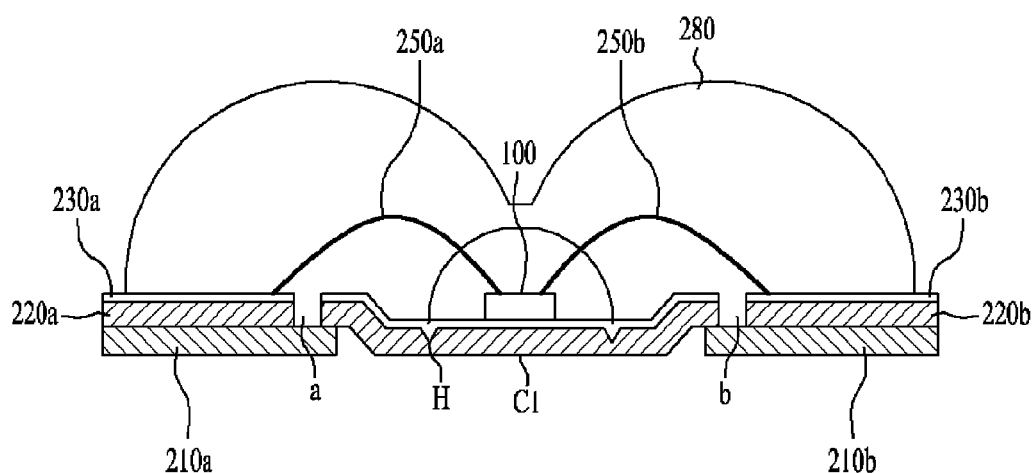
FIG. 10 is a longitudinal-sectional view of a light emitting device package in accordance with a fourth embodiment.
Figure 11:
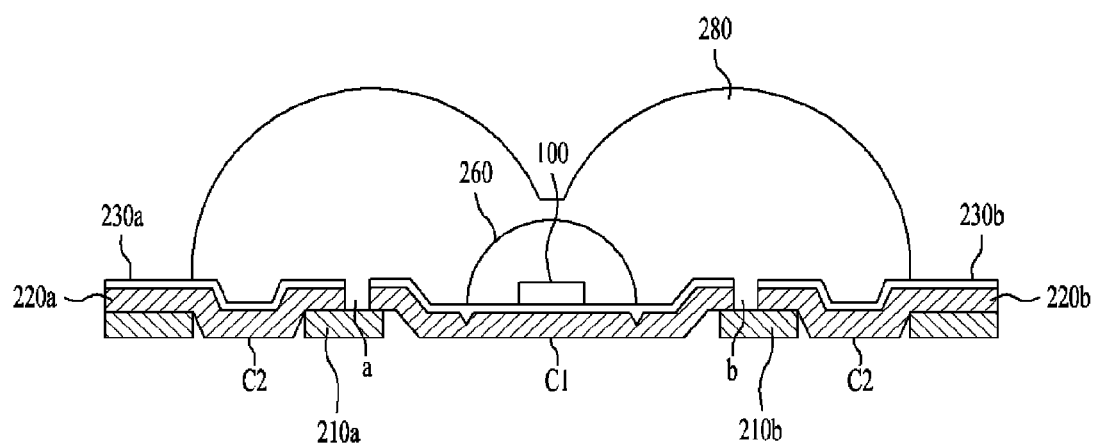
FIG. 11 is a longitudinal-sectional view of a light emitting device package in accordance with a fifth embodiment.

FIG. 8 is an exploded perspective view of a light emitting device package in accordance with a second embodiment, FIG. 9 is an exploded perspective view of a light emitting device package in accordance with a third embodiment, FIG. 10 is a longitudinal-sectional view of a light emitting device package in accordance with a fourth embodiment, and FIG. 11 is a longitudinal-sectional view of a light emitting device package in accordance with a fifth embodiment.

For example, FIG. 10 corresponds to a longitudinal-sectional view taken along the line I-I' of FIG. 8 or 9, and FIG. 11 corresponds to a longitudinal-sectional view taken along the line II-II' of FIG. 8 or 9.

A light emitting device package in accordance with one embodiment includes a lead frame 220 including a first lead frame 220a and a second lead frame 220b separated from each other, a first concave part C1 formed at a partial area of the second lead frame 220b, a light emitting device 100 disposed at the concave part C1 of the second lead frame 220b, a separation part b to electrically separate the first lead frame 220a and the second lead frame 220b from each other, a resin layer 260 including phosphors and formed on the concave part C1 of the second lead frame 220b and the light emitting device 100, a lens 280 formed on the resin layer 260 and the lead frame 220, and an insulating layer 210 disposed on the lower surface of the lead frame 220.

The first concave part C1 of the second lead frame 220b may be a first down-set area or a bending area formed at a partial area of the second lead frame 220b, without being limited thereto. For example, the first concave part C1 may be a first down-set area formed at the center of the lead frame 220. Otherwise, the first concave part C1 may be formed at an area overlapping the lens 280.

In accordance with the embodiment, the lead frame 220 is down-set to form the first concave part C1, and the light emitting device 100 is mounted at the first concave part C1 of the lead frame 220, thereby increasing structural stability.

Further, in accordance with the embodiment, after the first concave part C1 is formed on the lead frame 220, the light emitting device 100 is mounted at the first concave part C1, and the resin layer 260 including the phosphors is formed thereon, thereby allowing the resin layer 260 to be formed in a dome shape during encapsulation, providing uniform color temperature and thus improving color deviation.

For example, in accordance with the embodiment, the area of the phosphors is reduced by dotting the phosphors on the light emitting device 100, as compared to a conventional method of filling a cup with phosphors, thereby reducing color deviation to reduce generation of mura and decreasing the thickness of a set.

Further, in accordance with the embodiment, after the first concave part C1 is formed on the lead frame 220, the light emitting device 100 is mounted at the first concave part C1 and thus the height of the light emitting device 100 is lowered and the height of the wires during wire-bonding is reduced, thereby minimizing influence of thermal stress and thus reducing generation of a yellow ring due to thermal stress.

Further, in the embodiment, a groove H is formed at the first concave part C1 of the second lead frame 220b at the periphery of the resin layer 260, thereby forming the resin layer 260 including the phosphors in a dome shape and thus reducing color deviation.

Further, in the embodiment, the light emitting device package may further include second concave parts C2 respectively formed on the first lead frame 220a and the second lead frame 220b.

The second concave parts C2 may be second down-set areas or second bending areas formed at the corners of the first lead frame 220a and the second lead frame 220b, without being limited thereto. For example, the second concave parts C2 may be second down-set areas formed at the corners or the sides of the lead frames 220.

The second concave parts C2 are formed so as to contact the periphery of the lens 280. The second concave parts C2 disposed under the periphery of the lens 280 prevent deformation of the lens 280 due to thermal stress, thereby preventing delamination of the lens 280 and thus being capable of providing a light emitting device package and a lighting system having reinforced sealing against infiltration of moisture and improved reliability.

In accordance with one embodiment, the lens 280 may not contact the second concave parts C2, and in this case, structural stability may be increased by the second concave parts C2.

In accordance with the embodiment, the first lead frame 220a and the second lead frame 220b may be electrically separated by a separation part a, and a through part b is formed on the second lead frame 220b at a position symmetrical to the separation part a with respect to the first concave part C1, thereby increasing stability against thermal stress.

In order to prevent an electrical short, the conventional lead frames may be electrically separated by the separation part. Since the separation part and the through part are weak to introduction of moisture, a sealing property may be lowered and thus reliability may be lowered.

Therefore, in accordance with the embodiment, the separation part and the through part include curved portions to increase the lengths of paths along which moisture is introduced, thereby reinforcing sealing and thus improving reliability.

For example, in the light emitting device package in accordance with the second embodiment, as shown in FIG. 8 the separation part a and the through part b may have curved portions at positions adjacent to the first concave part C1, and thus increase the lengths of paths along which moisture is introduced, thereby reinforcing sealing and thus improving reliability.

Further, as shown in FIG. 8, the separation part a and the through part b may have curved portions at positions adjacent to the second concave parts C2, and thus increase the lengths of paths along which moisture is introduced, thereby reinforcing sealing and thus improving reliability.

Further, in accordance with the embodiment, the separation part a and the through part b may have curved portions at positions adjacent to the first concave part C1 and the second concave parts C2, and thus increase the lengths of paths along which moisture is introduced, thereby reinforcing sealing and thus improving reliability.

In accordance with the second embodiment, the separation part a and/or the through part b may have curved portions at positions adjacent to the first concave part C1 and/or the second concave parts C2 and have rectilinear portions at other areas, without being limited thereto.

Further, in the light emitting device package in accordance with the third embodiment, as shown in FIG. 9, the separation part a or the through part b may have curved portions at positions adjacent to the first concave part C1 and/or the second concave parts C2 and have irregular curved portions at other areas, and thus increase the lengths of paths along which moisture is introduced, thereby reinforcing sealing and thus improving reliability.

In accordance with the embodiments, the first concave part C1 may be formed at the center of the lead frame 220 between the through part b and the separation part a, and the second concave parts D2 may be formed at the corners of the lead frame 220 at the outside of the through part b and the separtation part a.

Although the drawings illustrate that two second concave parts C2 are formed at the corners of the first lead frame 220*a* and two second concave parts C2 are formed at the corners of the second lead frame 220*b*, the disclosure is not limited thereto. That is, at least one second concave part C2 may be formed at each of the corners of the first lead frame 220*a* and the second lead frame 220*b*.

The light emitting device 100 may be mounted at a mounting area of the first concave part C1 by a die-bonding adhesive, such as silicon or epoxy.

The light emitting device 100 may be electrically connected to the reflective layers 230*a* and 230*b* by wires 250*a* and 250*b*. For example, the light emitting device 100 may be electrically connected to the first reflective layer 230*a* by the first wire 250*a* and be electrically connected to the second reflective layer 230*b* by the second wire 250*b*.

In accordance with the embodiments, a light emitting device package and a lighting system having improved reliability and increased light efficiency may be provided.

Hereinafter, with reference to FIGS. 12 to 20, a fabrication method of a light emitting device package in accordance with one embodiment will be described in more detail. Such a fabrication method will be described with reference to longitudinal-sectional views taken along the line I-I' of FIG. 8 or 9, but the embodiments are not limited thereto.

Figure 12:
FIGS. 12 to 20 are longitudinal-sectional views of a fabrication method of the light emitting device package of FIG. 10.
Figure 13:
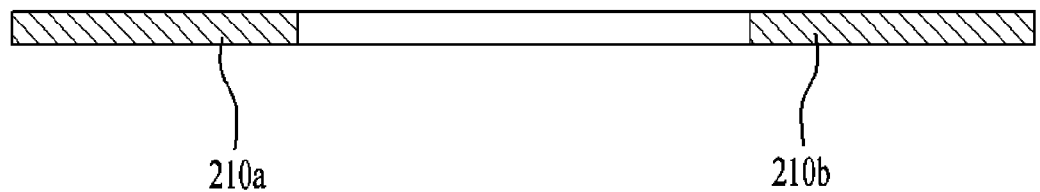

First, the insulating layer material 210 is prepared, as shown in FIG. 12, and insulating layers 210*a* and 210*b* are formed, as shown in FIG. 3. Although the insulating layers 210*a* and 210*b* may be formed by a punching process, the disclosure is not limited thereto.

The insulating layers 210*a* and 210*b* may include a first insulating layer 210*a* and a second insulating layer 210*b* respectively attached to the lower surfaces of the lead frame 220*a* and the second lead frame 220*b* which will be formed later. The insulating layers 210*a* and 210*b* serve to maintain an interval between the two lead frames 220*a* and 220*b* and to support and fix the two lead frames 220*a* and 220*b*.

The inculating layers 210*a* and 210*b* may have a thickness of about 65~85 micrometer (μm).

The insulating layers 210*a* and 210*b* cover areas of the through part b and the separation part a disposed between the two lead frames 220*a* and 220*b*. In this case, the insulating layers 210*a* and 210*b* may prevent leakage of a liquid resin material through the through part b and the separation part a during a process of forming the resin layer 260.

The insulating layer material 210 includes a light transmitting film or a light blocking film, and, for example, may include one selected from the group consisting of a polyimide (PI) film, a polyethylene terephthalate (PET) film, an ethylene vinyl acetate (EVA) film, a polyethylene naphthalate (PEN) film, a triacetyl cellulose (TAC) film, a polyamide-polyimide (PAI) film, a poly ether-ether-ketone (PEEK) film, a perfluoroalkoxy (PFA) film, a polyphenylene sulfide (PPS) film, resin films (PE, PP and PET films), etc.

Figure 14:
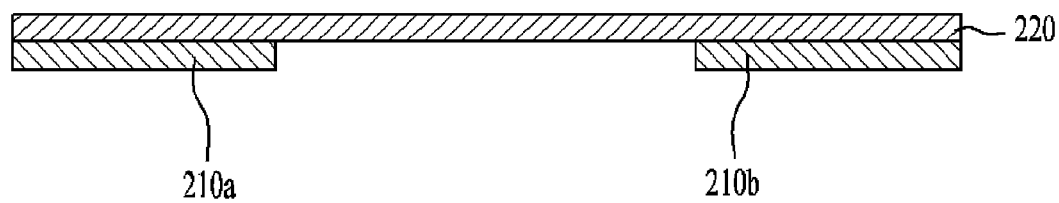

Thereafter, the lead frame 220 is formed on the insulating layers 210*a* and 210*b*, as shown in FIG. 14. For example, the lead frame 220 may be formed of copper, an alloy including copper (Cu), such as Cu—Ni or Cu—Mg—Sn, an alloy including iron (Fe), such as Fe—Ni, aluminum (Al), or an alloy including aluminum (Al), without being limited thereto.

The lead frame 220 may have a thickness of about 15~300 μm. Further, the lead frame 220 may have a thickness of about 15~35 μm, and may function as both a support frame to support the light emitting device and a heat dissipation member to dissipate heat generated from the light emitting device.

Thereafter, the lead frame 220 may be separated into the first lead frame 220*a* and the second lead frame 220*b* through etching, as shown in FIG. 1.

In the embodiment, the first lead frame 220*a* and the second lead frame 220*b* may be electrically separated from the separation part a, and the through part b is formed on the second lead frame 222 at a position symmetrical to the separation part a with respect to the first concave part C1, which will be formed later, so that the first lead frame 220*a* and the second lead frame 220*b* are stable against thermal stress. The through part b and the separation part a may be formed during etching of the lead frame 220.

In the embodiment, the through part b and the separation part a include curved portions to increase the lengths of paths along which moisture is introduced, thereby reinforcing sealing and thus improving reliability.

For example, in the light emitting device package in accordance with the second embodiment, as shown in FIG. 8, the separation part a or the through part b may have curved portions at positions adjacent to the first concave part C1, and thus increase the lengths of paths along which moisture is introduced, thereby reinforcing sealing and thus improving reliability.

Further, in the light emitting device package in accordance with the second embodiment, the separation part a or the through part b may have curved portions at positions adjacent to the second concave parts C2, and thus increase the lengths of paths along which moisture is introduced, thereby reinforcing sealing and thus improving reliability.

Further, in the light emitting device package in accordance with the second embodiment, the separation part a or the through part b may have curved portions at positions adjacent to the first concave part C1 and the second concave parts C2, and thus increase the lengths of paths along which moisture is introduced, thereby reinforcing sealing and thus improving reliability.

Further, in the light emitting device package in accordance with the third embodiment, as shown in FIG. 9, the separation part a or the through part b may have curved portions at positions adjacent to the first concave part C1 and/or the second concave parts C2 and have irregular curved portions at other areas, and thus increase the lengths of paths along which moisture is introduced, thereby reinforcing sealing and thus improving reliability.

Figure 15:
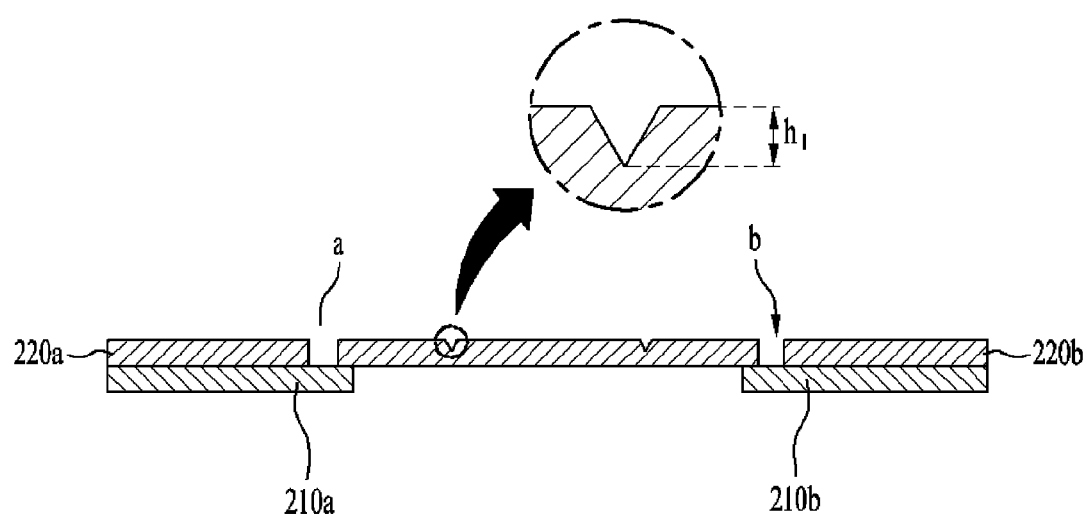

Thereafter, with reference to FIG. 15, a groove H is formed at an area of the second lead frame 220b corresponding to the periphery of the resin layer 260, thereby forming the resin layer 260 including the phosphors in a dome shape and thus reducing color deviation. The depth ($h_1$) of the groove H is a third part (⅓) to two third parts (⅔) of a thickness of the first lead frame 220a and the second lead frame 220b.

The groove H formed on the second lead frame 220b may be formed so as not to pass through the second lead frame 220b by half-etching, but the disclosure is not limited thereto.

Figure 16:
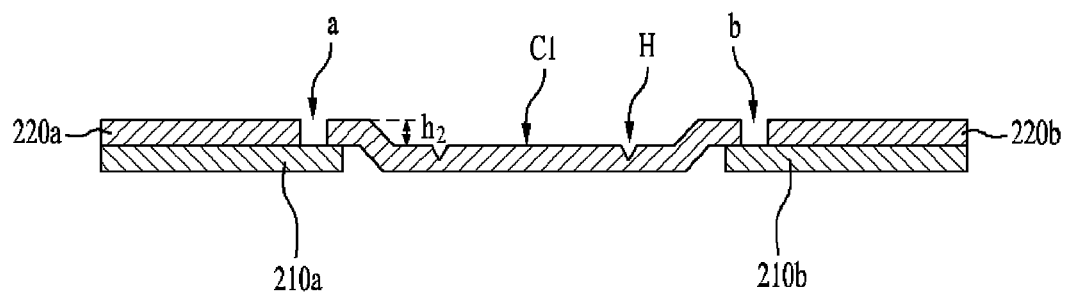
Figure 17:
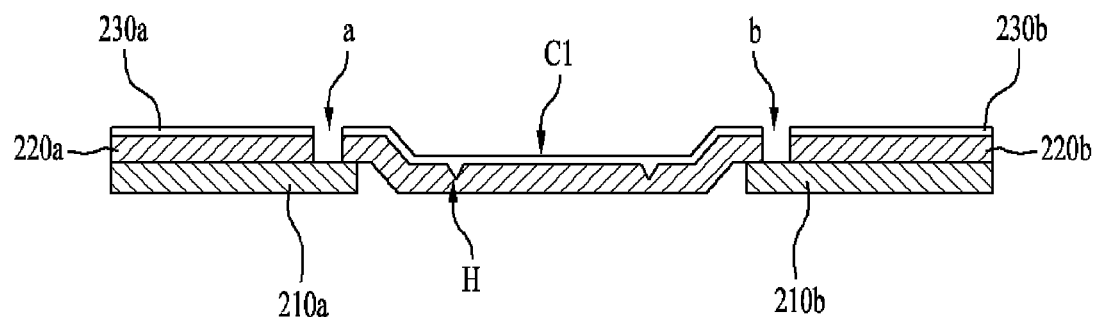

Thereafter, as shown in FIG. 16, the first concave part C1 is formed on the lead frame 220. In accordance with the embodiment, the lead frame 220 is down-set to form the first concave part C1, and the light emitting device 100 is mounted at the first concave part C1 of the lead frame 220, thereby increasing structural stability.

For example, the first concave part C1 may be a first down-set area or a bending area formed at a partial area of the second lead frame 222, but the disclosure is not limited thereto. For example, the first concave part C1 may be a first down-set area formed at the center of the lead frame 220. Otherwise, the first concave part C1 may be formed at an area overlapping the lens 280.

In accordance with the embodiment, after formation of the first concave part C1 on the lead frame 220, the light emitting device 100 is mounted at the first concave part C1 and the resin layer 260 including phosphors is formed thereon, thereby allowing the resin layer 260 to be formed in a dome shape during encapsulation and thus providing uniform color temperature and improving color deviation.

The depth $h_2$ of the first concave part C1 may be substantially equal to the thickness of the insulating layer 210a and 210a, or may be 90% to 110% of the insulating layer 210a and 210b.

For example, in accordance with the embodiment, the area of the phosphors is reduced by dotting the phosphors on the light emitting device 100, as compared to a conventional method of filling a cup with phosphors, thereby reducing color deviation to reduce generation of mura and decreasing the thickness of a set.

Further, in accordance with the embodiment, after the first concave part C1 is formed on the lead frame 220, the light emitting device 100 is mounted at the first concave part C1 and thus the height of the light emitting device 100 is lowered and the height of the wires during wire-bonding is reduced, thereby minimizing influence of thermal stress and thus reducing generation of a yellow ring due to thermal stress.

Further, in the embodiment, the second concave parts C2 may be formed at the corners or the sides of the lead frame 220 during formation of the first concave part C1 (with reference to FIGS. 1, 2 and 4). For example, the second concave parts C2 may be second down-set areas or bending areas formed at the corners of the first lead frame 220a and the second lead frame 220b, but the disclosure is not limited thereto.

The formation process of the second concave parts C2 may be carried out simultaneously with the formation process of the first concave part C1, but the disclosure is not limited thereto.

In accordance with the embodiment, since the second concave parts C2 are formed so as to contact the periphery of the lens 280 which will be formed later, the second concave parts C2 disposed under the periphery of the lens 280 prevent deformation of the lens 280 due to thermal stress, thereby preventing delamination of the lens 280 and thus being capable of providing a light emitting device package and a lighting system having reinforced sealing against infiltration of moisture and improved reliability.

In the embodiment, the lens 280 may not contact the second concave parts C2, and in this case, structural stability may be increased by the second concave parts C2.

The first concave part C1 may be formed at the center of the lead frame 220 between the through part b and the separation part a, and the second concave parts C2 may be formed at the corners of the lead frame 220 at the outside of the through part b and the separation part a.

Although the drawings illustrate that two second concave parts C2 are formed at the corners of the first lead frame 220a and two second concave parts C2 are formed at the corners of the second lead frame 220b, the disclosure is not limited thereto. That is, at least one second concave part C2 may be formed at each of the corners of the first lead frame 220a and the second lead frame 220b.

Thereafter, a reflective layer 230 may be formed on the lead frame 220, as shown in FIG. 10. The reflective layer 230 may include a first reflective layer 230a formed on the first lead frame 220a and a second reflective layer 230b formed on the second lead frame 220b.

The reflective layer 230 may be formed of silver (Ag), nickel (Ni), aluminum (Al) or an alloy thereof, but the disclosure is not limited thereto.

Figure 18:
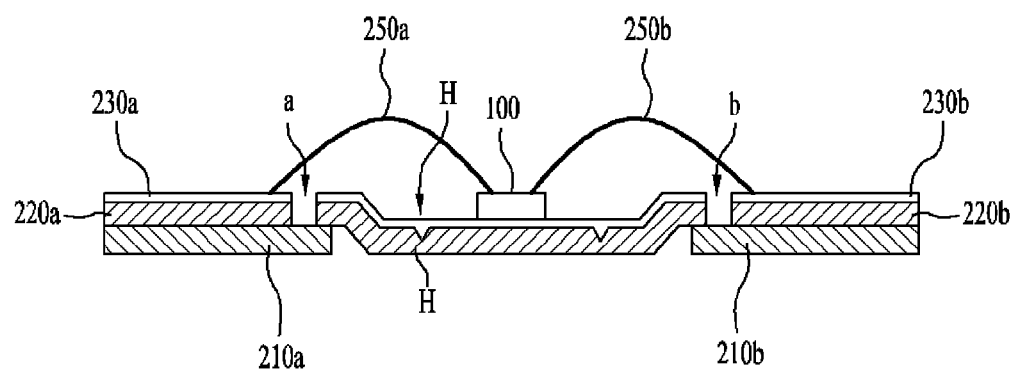

Thereafter, as shown in FIG. 18, the light emitting device 100 is mounted at the first concave part C1 of the second lead frame 222. For example, the light emitting device 100 may be mounted at a mounting area of the first concave part C1 by a die-bonding adhesive (not shown), such as silicon or epoxy.

Thereafter, the light emitting device 100 may be electrically connected to the first lead frame 220a by a first wire 250a and be electrically connected to the second lead frame 220b by a second wire 250b.

In accordance with the embodiment, the light emitting device 100 is mounted at the first concave part C1 of the lead frame 220 and thus the height of the light emitting device 100 is lowered and the height of the wires during wire-bonding is reduced, thereby minimizing influence of thermal stress and thus reducing generation of a yellow ring due to thermal stress.

Figure 19:
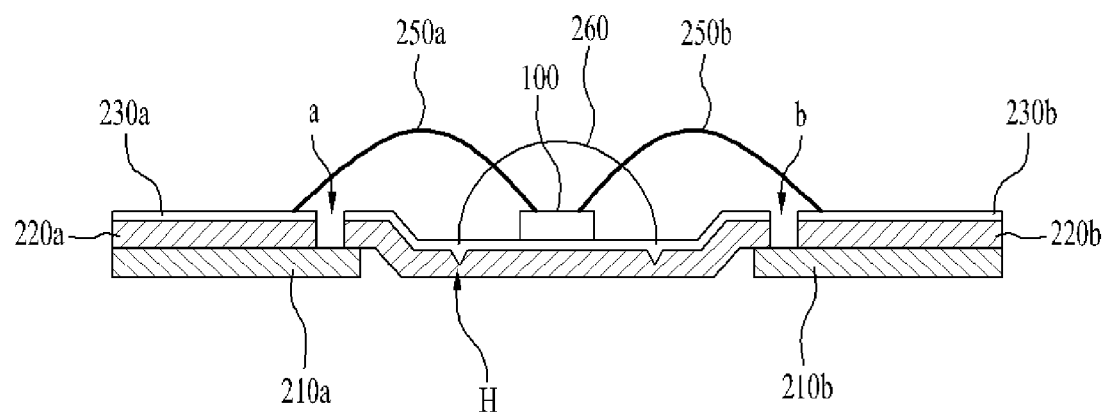

Thereafter, as shown in FIG. 19, the resin layer 260 including phosphors is formed on the light emitting device 100 mounted at the first concave part C1 of the second lead frame 222.

In accordance with the embodiment, after formation of the first concave part C1 on the lead frame 220, the light emitting device 100 is mounted at the first concave part C1 and the resin layer 260 including phosphors is formed thereon, thereby allowing the resin layer 260 to be formed in a dome shape during encapsulation and thus providing uniform color temperature and improving color deviation.

For example, in accordance with the embodiment, the area of the phosphors is reduced by dotting the phosphors on the light emitting device 100, as compared to a conventional method of filling a cup with phosphors, thereby reducing color deviation to reduce generation of mura and decreasing the thickness of a set.

Figure 20:
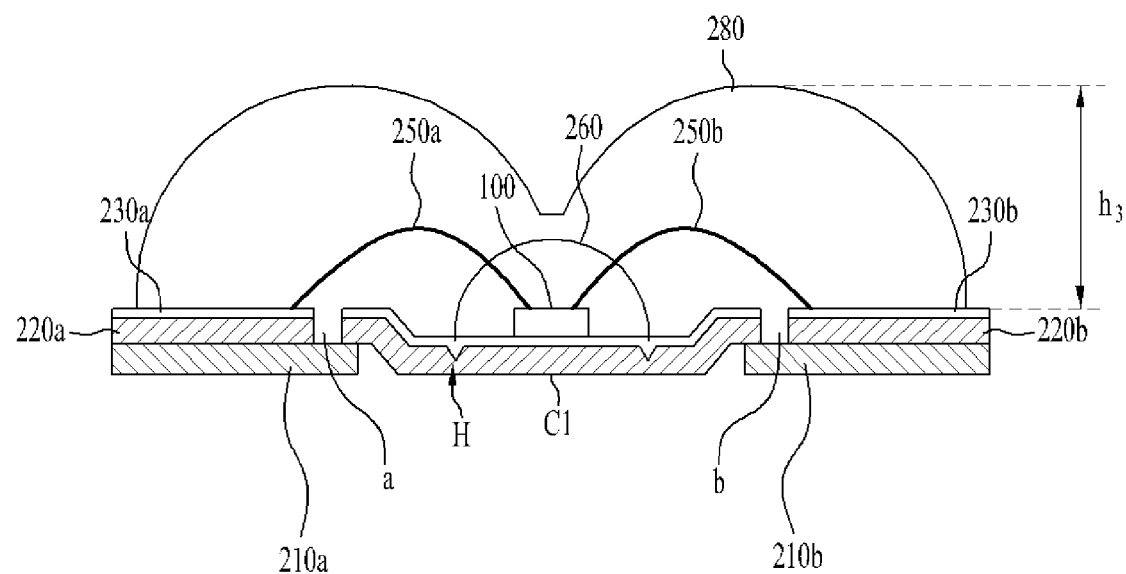

Thereafter, as shown in FIG. 20, the lens 280 is formed on the resin layer 260 and the lead frame 220.

In the embodiment, the lens 280 may have a shape provided with a concave central portion and a circular peripheral portion. The lens 280 may be formed of a material having similar physical properties to the material of the resin layer 260 so as to minimize thermal expansion due to thermal stress. For example, the lens 280 may be formed of silicon, but the disclosure is not limited thereto. A height $h_3$ of the lens 280 is higher than that of the light emitting device 100, and may be 1.4 mm to 1.7 mm.

In accordance with the embodiment, a light emitting device package and a lighting system having improved reliability and increased light efficiency may be provided.

An array of a plurality of light emitting device packages in accordance with the embodiments may be provided, and optical members, such as a light guide panel, a prism sheet, a diffusion sheet, etc., may be disposed on an optical path of the light emitting device packages. The light emitting device packages and the optical members may function as a light unit. In accordance with another embodiment, the light emitting devices or the light emitting device package in accordance with the above-described embodiments may constitute an image display apparatus, an indicating apparatus or a lighting system, and, for example, the lighting system may include a lamp or a streetlight.

Hereinafter, as examples of a lighting system including the above-described light emitting device packages, a lighting apparatus and a backlight unit will be described.

Figure 21:
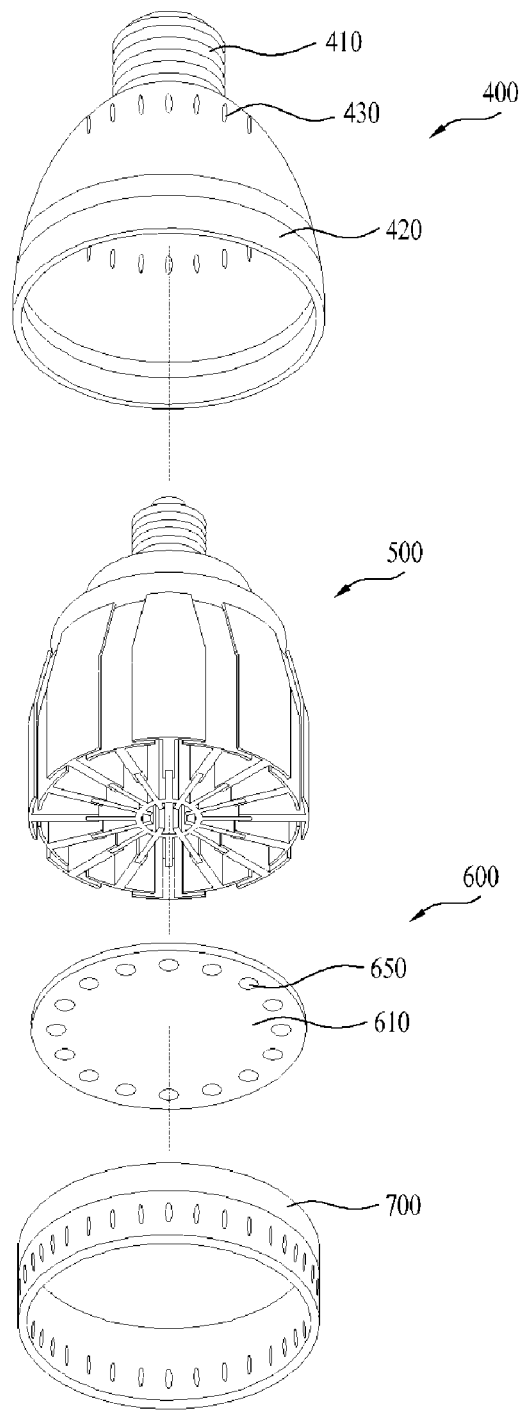
FIG. 21 is an exploded perspective view of a lighting apparatus including light emitting device packages.

FIG. 21 is an exploded perspective view of a lighting apparatus including light emitting device packages in accordance with one embodiment.

The lighting apparatus in accordance with the embodiment includes a light source 600 to project light, a housing 400 in which the light source 600 is installed, a heat dissipation unit 500 to dissipate heat generated by the light source 600, and a holder 700 to connect the light source 600 and the heat dissipation unit 500 to the housing 400.

The housing 400 includes a socket connector 410 connected to an electrical socket (not shown) and a body 420 connected to the socket connector 410 and accommodating the light source 600. One air flow hole 430 may be formed through the body 420.

A plurality of air flow holes 430 may be disposed on the body 420 of the housing 400. One air flow hole 430 may be disposed, or plural air flow holes 430 may be disposed in a radial shape, as shown in FIG. 21, or in various other shapes.

The light source 600 includes a plurality of light emitting device packages 650 on a circuit board 610. Here, the circuit board 610 may have a shape which is capable of being inserted into an opening of the housing 400, and the light emitting device packages 650 may have a thin thickness and excellent heat dissipation characteristics and optical characteristics, as described above.

The holder 700 is disposed under the light source 600. The holder 700 may include a frame and air flow holes. Further, although not shown in FIG. 21, optical members may be disposed under the light source 600 so as to diffuse, scatter or converge light emitted from the light emitting device packages 650 of the light source 600.

In the light emitting device package 650 disposed in the lighting apparatus, as described above, the polyimide layer is identically exposed at both sides of the light emitting device and thus unbalance of light distribution due to non-uniform absorption of light by the polyimide layer may be prevented, the package body is omitted and the circuit board is disposed on the upper surfaces of the lead frames and thus the thickness of the light emitting device package 650 may be reduced.

Figure 22:
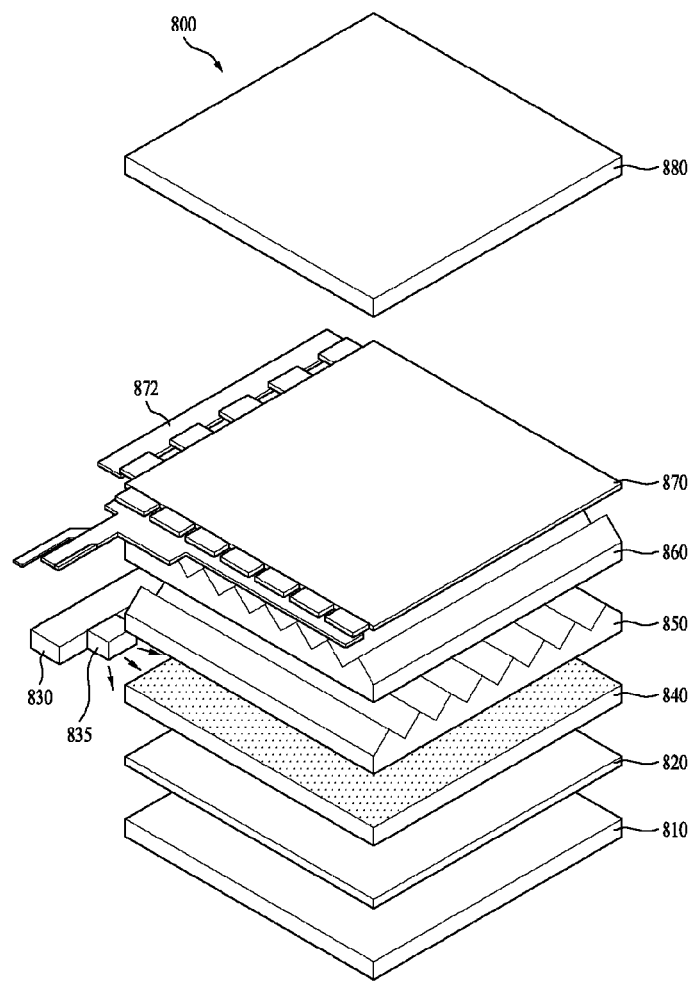
FIG. 22 is an exploded perspective view of a first embodiment of an image display apparatus including light emitting device packages.

FIG. 22 is an exploded perspective view of an image display apparatus including light emitting device packages in accordance with one embodiment.

The image display apparatus 800 in accordance with the embodiment includes a bottom cover 810, a reflective plate 820 disposed on the bottom cover 810, a light source module to emit light, a light guide panel 840 disposed in front of the reflective plate 820 to guide light emitted from the light source module to the front part of the image display apparatus, optical sheets including prism sheets 850 and 860 disposed in front of the light guide panel 840, a display panel 870 disposed in front of the optical sheets, an image signal output circuit 872 connected to the display panel 870 to supply an image signal to the display panel 870, and a color filter 880 disposed in front of the display panel 870. Here, the bottom cover 810, the reflective plate 820, the light source module, the light guide panel 840 and the optical sheets may constitute a backlight unit.

The light source module includes a substrate 830 and light emitting device packages 835 disposed on the substrate 830. Here, the substrate 830 may be a PCB, and the light emitting device packages 835 have a thin thickness and excellent optical characteristics, as described above.

The bottom cover 810 may accommodate the components within the image display apparatus 800. Further, the reflective plate 820 may be provided as a separate component, as shown in FIG. 22, or be provided by coating the rear surface of the light guide panel 840 or the front surface of the bottom cover 810 with a material having high reflectivity.

Here, the reflective plate 820 may be formed of a material having high reflectivity and usable as an ultra-thin film, such as polyethylene terephthalate (PET).

Further, the light guide panel 840 scatters light emitted from the light source module to uniformly distribute the light throughout the entirety of a screen of a liquid crystal display. Therefore, the light guide panel 840 may be formed of a material having a high index of refraction and high transmittance, such as polymethylmethacrylate (PMMA), polycarbonate (PC), polyethylene (PE) or a resin injection-molded product. Further, an air guide method in which the light guide panel 840 is omitted and light is transmitted by air above the reflective plate 820 may be used.

The first prism sheet 850 may be formed of a polymer having light transmittance and elasticity on one surface of a support film, and the polymer may have a prism layer in which a plurality of 3D structures is repeated. Here, the plural structures may be provided in a stripe pattern in which ridges and valleys are repeated, as shown in FIG. 22.

The arrangement direction of ridges and valleys on one surface of a support film of the second prism sheet 860 may be perpendicular to the arrangement direction of the ridges and valleys on one surface of the support film of the first prism sheet 850. This serves to uniformly distribute light transmitted from the light source module and a reflective sheet to the entire surface of the display panel 870.

Although not shown in FIG. 22, a protective sheet may be disposed on each of the prism sheets 850 and 860, and may include a protective layer including light diffusing particles and a binder on both surfaces of a support film. Further, the prism layer may be formed of a polymer selected from the group consisting of polyurethane, a styrene-butadiene copolymer, polyacrylate, polymethacrylate, polymethylmethacrylate, polyethylene terephthalate elastomer, polyisoprene, and polysilicon.

Further, although not shown in FIG. 22, a diffusion sheet may be disposed between the light guide panel 840 and the first prism sheet 850. The diffusion sheet may be formed of a polyester or polycarbonate-based material, and may maximally increase the projection angle of light incident from the backlight unit through refraction and scattering. The diffusion sheet may include a support layer including a light diffusing agent, and a first layer and a second layer excluding a light diffusion agent and formed on a light emitting surface (in the direction of the first prism sheet) and a light entering surface (in the direction of the reflective sheet).

Although the embodiment illustrates the optical sheets as including a combination of the diffusion sheet, the first prism sheet 850 and the second prism sheet 860, the optical sheets may include other combinations, for example, a micro-lens array, a combination of a diffusion sheet and a micro-lens array, or a combination of a prism sheet and a micro-lens array.

The display panel 870 may employ a liquid crystal display panel, or other kinds of display apparatuses requiring a light source in addition to the liquid crystal display panel. The liquid crystal display panel includes a plurality of liquid crystals disposed between two transparent substrates, and polarizing plates are respectively mounted on the substrates.

For example, the display panel 870 has a structure in which a liquid crystal layer is located between both glass substrates and polarizing plates are respectively mounted on the glass substrates to utilize polarization of light. Here, the liquid crystal layer has intermediate properties between a liquid and a solid in which organic molecules having fluidity like a liquid, i.e., liquid crystals, are regularly arranged, and displays an image using change of molecular arrangement by application of an external electric field. The liquid crystal display panel used in the image display apparatus is an active matrix type, and uses transistors as switches to adjust voltage applied to respective pixels. Further, the color filter 880 is disposed on the front surface of the display panel 870, and transmits only red, green and blue light projected by the display panel 870 per pixel.

Figure 23:
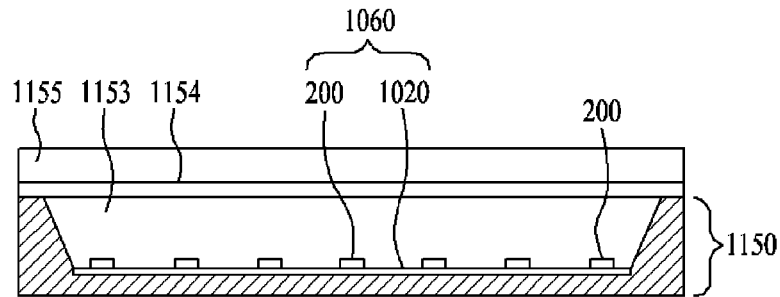
FIG. 23 is a longitudinal-sectional view of a second embodiment of an image display apparatus in accordance with another embodiment.

FIG. 23 is a longitudinal-sectional view of an image display apparatus in accordance with another embodiment.

With reference to FIG. 23, the image display apparatus in accordance with the embodiment includes a bottom cover 1152, a substrate 1020 on which an array of the above-described light emitting device packages 200 is disposed, optical members 1154 and a display panel 1155.

The substrate 1020 and the light emitting device packages 200 may define a light emitting module 1060. The bottom cover 1152, at least one light emitting module 1060 and the optical members 1154 may define a light unit 1150.

The bottom cover 1152 may be disposed with an accommodation part 1153, but the disclosure is not limited thereto.

Here, the optical members 1154 may include at least one of a lens, a light guide panel, a diffusion sheet, horizontal and vertical prism sheets and a brightness reinforcing sheet. The light guide panel may be formed of polymethylmethacrylate (PMMA) or polycarbonate (PC), and may be omitted. The diffusion sheet serves to diffuse incident light, the horizontal and vertical prism sheets serve to concentrate incident light at a display area, and the brightness reinforcing sheet serves to reuse loss of light to improve brightness.

The optical members 1154 are disposed on the light source module 1060, and serve to convert light emitted from the light source module 1060 into surface light or to diffuse and concentrate light.

In the light emitting device packages provided in the above-described image display apparatuses, as described above, the polyimide layer is identically exposed at both sides of the light emitting device and thus unbalance of light distribution due to non-uniform absorption of light by the polyimide layer may be prevented, and the package body is omitted and the circuit board is disposed on the upper surfaces of the lead frames and thus the thickness of the light emitting device package may be reduced.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a first lead frame and a second lead frame disposed on an insulating layer and electrically separated from each other by a separation part; and
a light emitting device disposed on the second lead frame and electrically connected to the first lead frame, the light emitting device including a light emitting structure having a first conduction type semiconductor layer, an active layer, and a second conduction type semiconductor layer,
wherein the second lead frame includes a through part disposed opposite to the separation part such that the light emitting device is located therebetween,
wherein a first concave part is disposed on the second lead frame, and the light emitting device is disposed in the first concave part,
wherein a bottom surface of the first concave part of the second lead frame is lower than other portions of the second lead frame,
wherein second concave parts are disposed on the first lead frame and the second lead frame, and
wherein the cross-section of at least a portion of the separation part and/or the through part has an irregular curved shape, and the irregular curved shape of the separation part and/or the through part corresponds to the second concave parts.

2. The light emitting device package according to claim 1, wherein the width of the separation part is substantially equal to the width of the through part.

3. The light emitting device package according to claim 1, wherein the width of the through part is 20~40 μm.

4. The light emitting device package according to claim 1, wherein a distance between the through part and the light emitting device is substantially equal to a distance between the separation part and the light emitting device.

5. The light emitting device package according to claim 1, wherein the shape of the separation part is substantially equal to the shape of the through part.

6. The light emitting device package according to claim 1, wherein the overall length of the separation part is greater than the overall length of the through part.

7. The light emitting device package according to claim 1, wherein the irregular curved shape of the separation part and the irregular curved shape of the through part are symmetrical with respect to a point, or are symmetrical with respect to a line.

8. The light emitting device package according to claim 1, further comprising a lens surrounding the light emitting device,
wherein the width of the through part is substantially equal to the width of the separation part disposed opposite to the through part so that the light emitting device is located therebetween.

9. The light emitting device package according to claim 8, wherein the irregular curved shape of the separation part or the through part corresponds substantially to the lens.

10. The light emitting device package according to claim 8, wherein the area of the separation part corresponding to the lens is substantially equal to the area of the through part corresponding to the lens.

11. The light emitting device package according to claim 1, wherein a distance between the first concave part and the through part is substantially equal to a distance between the first concave part and the separation part.

12. The light emitting device package according to claim 11, further comprising a resin layer on the light emitting device, disposed on the second lead frame and including phosphors,
wherein a groove is disposed on the second lead frame corresponding to the edge of the resin layer.

13. The light emitting device package according to claim 1, wherein the cross-section of at least one of the first lead frame or the second lead frame has a curved shape at positions adjacent to the second concave parts.

14. The light emitting device package according to claim 1, wherein the second concave parts are disposed at the corners of the first lead frame and the corners of the second lead frame.

15. A light emitting device package comprising:
a first lead frame and a second lead frame disposed on an insulating layer and electrically separated from each other by a separation part; and
a light emitting device disposed on the second lead frame and electrically connected to the first lead frame, the light emitting device includes a light emitting structure having a first conduction type semiconductor layer, an active layer, and a second conduction type semiconductor layer,
wherein the second lead frame includes a through part disposed opposite to the separation part so that the light emitting device is located therebetween,
wherein a first concave part is disposed on the second lead frame,
wherein the light emitting device is in the first concave part,
wherein second concave parts are disposed at edges of the first lead frame and the second lead frame, and
wherein in a side view of the second lead frame, at least a portion of the separation part and/or the through part has an irregular curved shape, and the irregular curved shape of the separation part and/or the through part corresponds to the second concave parts.

16. A lighting system comprising:
a light emitting device package including a first lead frame and a second lead frame disposed on an insulating layer and electrically separated from each other by a separation part, and a light emitting device disposed on the second lead frame and electrically connected to the first lead frame, the light emitting device including a light emitting structure having a first conduction type semiconductor layer, an active layer, and a second conduction type semiconductor layer, the second lead frame including a through part disposed opposite to the separation part such that the light emitting device located therebetween, and a resin layer disposed on the light emitting device, disposed on the second lead frame and including phosphors;
a circuit board electrically connected to the first lead frame and the second lead frame; and
optical members transmitting light emitted from the light emitting device package,
wherein a groove is disposed on the second lead frame corresponding to an edge of the resin layer,
wherein a first concave part is disposed on the second lead frame, the light emitting device is in the first concave part, and second concave parts are disposed at edges of the first lead frame and the second lead frame,
wherein a bottom surface of the first concave part of the second lead frame is lower than other portions of the second lead frame, and
wherein a cross-section of at least a portion of the separation part and/or the through part has an irregular curved shape, and the irregular curved shape of the separation part and/or the through part corresponds to the second concave parts.

17. The light emitting device package according to claim 15, wherein the width of the separation part is substantially equal to the width of the through part.

18. The light emitting device package according to claim 15, wherein the cross-section of at least one of the first lead frame or the second lead frame has a curved shape at positions adjacent to the second concave parts.

19. The lighting system according to claim 16, wherein the width of the separation part is substantially equal to the width of the through part.

20. The lighting system according to claim 16, wherein the cross-section of at least one of the first lead frame or the second lead frame has a curved shape at positions adjacent to the second concave parts.

* * * * *